United States Patent [19]
Watanabe

[11] Patent Number: 5,326,937
[45] Date of Patent: Jul. 5, 1994

[54] GROUNDING STRUCTURE OF A PRINTED WIRING BOARD

[75] Inventor: Shinya Watanabe, Inagi, Japan

[73] Assignee: Fujitsu Isotec Limited, Inagi, Japan

[21] Appl. No.: 7,963

[22] Filed: Jan. 22, 1993

[30] Foreign Application Priority Data

Jan. 28, 1992 [JP] Japan .................................. 4-012867

[51] Int. Cl.$^5$ ................................................ H05K 1/11
[52] U.S. Cl. .................................... 174/263; 174/266; 174/262
[58] Field of Search ............... 174/250, 261, 262, 263, 174/266; 439/81, 82, 83

[56] References Cited

U.S. PATENT DOCUMENTS 4,652,971  3/1987  Peterson et al. ..................... 361/386
4,851,614  7/1989  Duncan, Jr. ......................... 174/68.5

Primary Examiner—Leo P. Picard
Assistant Examiner—L. Thomas
Attorney, Agent, or Firm—Armstrong, Westerman, Hattori, McLeland & Naughton

[57] ABSTRACT

At least one grounding through hole filled with solder is provided in a printed wiring board near by a fixing hole through which a screw fixes the board to a frame, penetrating a ground layer provided on an upper surface of the board and a substrate, made of insulating material, of the board. A metal layer made of electrically conductive and solderable material is plated on an inner surface of the grounding through hole so that melted solder is raised to an upper surface of the board. An upper end of the metal layer is formed to a flange electrically connected with the ground pattern so that the melted solder is raised from the upper surface of the board, forming a spherical end of the solder.

5 Claims, 3 Drawing Sheets

GROUNDING STRUCTURE OF A PRINTED WIRING BOARD

BACKGROUND OF THE INVENTION

Field of the Invention

The present invention relates to a printed wiring board, and in particular the present invention relates to grounding structure of the printed wiring board, for grounding a ground pattern printed on the printed wiring board to a frame of an electrical apparatus including the printed wiring boards.

Description of the Related Art

When a ground pattern is provided on a printed wiring board, the ground pattern is grounded to a metallic frame of an electrical apparatus including the printed wiring board by using metallic screws. The metallic screws will be called "fixing screws" hereinafter. A plurality of holes are provided in the printed wiring board for passing the fixing screws therethrough. FIG. 1 shows a case in the prior art that a fixing screw 30 fixes a printed wiring board 100 to a frame, not depicted in FIG. 1, through a fixing hole 91 provided in printed wiring board 100 by penetrating a ground pattern 92 provided on an upper surface of printed wiring board 100. In FIG. 1, electrically conductive material 93, which will be simply called "conductive material 93" hereinafter, is plated on an inner surface of fixing hole 91 so as to be electrically connected with ground pattern 92, and solder 50 is soldered on an inner surface of fixing hole 91 so that an upper end of solder 50 is swelled over an upper edge of conductive material 93, rising from the upper surface of printed wiring board 100. The fixing screw 30 screws printed wiring board 100 to the frame, pushing the upper end of solder 50 by a lower surface of a head 30a of fixing screw 30, so that ground pattern 92 is grounded to the frame through solder 50 and fixing screw 30 mechanically tightly touching solder 50.

On a printed wiring board, electrical elements are usually soldered by using through holes provided in the printed wiring board. Soldering is usually performed by dipping a lower surface of the printed wiring board into melted solder so as to fill the melted solder into the through holes with legs of the electrical elements.

However, the above soldering process for the electrical elements cannot be applied to fixing hole 91. Because, if the above soldering process is applied to fixing hole 91, fixing hole 91 would be filled with solder 50 so that fixing screw 30 could not be screwed to the frame through fixing hole 91. Therefore, fixing hole 91 must be soldered by using a soldering iron, putting the soldering iron by hand at the upper edge of conductive material 93 one by one. As a result, in the prior art, there has been a problem that the working efficiency in soldering of the printed wiring board decreases and the fabricating costs of the printed wiring board increase.

SUMMARY OF THE INVENTION

Therefore, the present invention has an object to offer a printed wiring board having grounding structure by which a ground pattern provided on the printed wiring board can be grounded to a metallic frame for equipping the printed wiring boards, by screwing fixing screws to the frame through fixing holes as usual, however, by simple and easy soldering process, increasing the working efficiency of the soldering process for the printed wiring board and decreasing the fabricating costs of the printed wiring board.

The above object can be achieved by providing a plurality of through holes only to be filled with solder, near by the fixing hole so that the lower surface of the head of the fixing screw touches upper surfaces of solder filled in the through holes when the printed wiring board is fixed to the frame by the fixing screw screwed into the frame through the fixing hole. An inner surface of each through hole is plated with electrically conductive material so that an upper edge of the conductive material is electrically connected with the ground pattern on the printed wiring board. On the contrary, nothing is plated on an inner surface of the fixing hole. As a result, when the lower surface of the printed wiring board is dipped in the melted solder, the melted solder is filled in the through holes along the conductive material by capillary action of the melted solder, however, no melted solder is filled in the fixing hole. The upper end of the melted solder filled in each through hole is raised from the upper surface of the printed wiring board, forming a spherical surface because of the surface tension and viscosity of the melted solder. The through holes mentioned above will be called "grounding through holes" hereinafter in comparison with usual through holes used for soldering the electrical elements. The melted solder filled in the grounding through holes is hardened. As a result, the ground pattern on the printed wiring board is grounded to the frame through the spherical upper ends of solder filled in the grounding through holes and the fixing screw.

Because of applying the present invention to the printed wiring board, the soldering process for the grounding becomes simple so that the grounding through holes can be soldered at the same time the usual through holes are soldered for soldering the electrical elements, not necessary to solder the fixing hole by using the soldering iron, which reduces the costs of the soldering process and increasing the reliability of the grounding.

DESCRIPTION OF THE PREFERRED EMBODIMENTS

Figure 2:
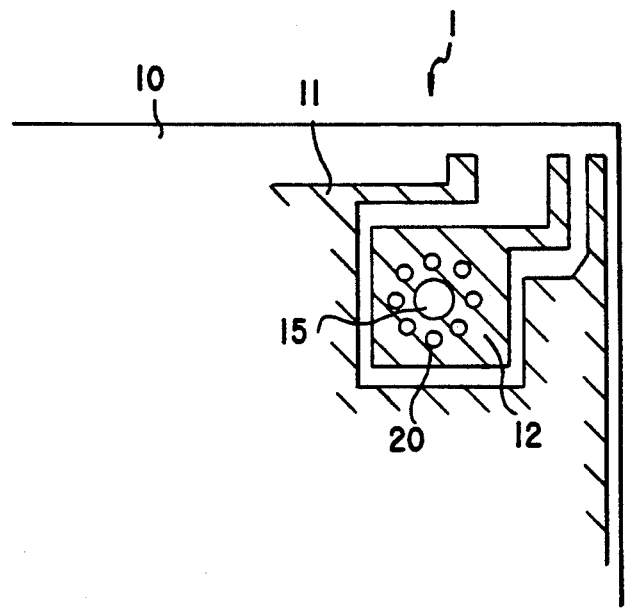
FIG. 2 is a partially plane view of grounding structure embodying the present invention, of a printed wiring board, illustrating that eight grounding through holes are provided around the fixing screw provided in a ground pattern on the printed wiring board.

FIG. 2 is a partial plane view of a printed wiring board 1 embodying the present invention. The printed wiring board 1 is fabricated by printing a wiring pattern 11 and a ground pattern 12 on a substrate 10 made of an electrically insulating material such as a plastic material being e.g. 1.6 mm in thickness, and various electrical elements not depicted in FIG. 2 are laid on wiring pattern 11. The upper surfaces of wiring pattern 11 and ground pattern 12 are coated by a resist layer being e.g. 70 micrometer in thickness. The ground pattern has a relatively wide area in which a fixing hole and grounding through holes are provided. For example in FIG. 2, an approximately square pattern is provided in ground pattern 12, and a fixing hole 15 being e.g. 3.6 mm in diameter and eight grounding through holes 20 each being e.g. 0.9 mm in diameter are fabricated in the square pattern so that grounding through holes 20 surround fixing hole 15.

Figure 3:
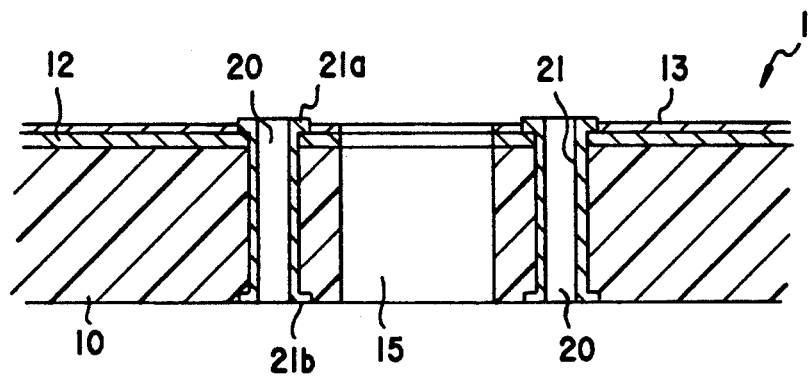
FIG. 3 is a partially cross sectional view of the grounding structure embodying the present invention in reference to FIG. 2.

FIG. 3 is a partially cross sectional view around fixing hole 15 and two grounding through holes 20 provided near by fixing hole 15. In FIG. 3, the same reference numeral as in FIG. 2 designates the same part as in FIG. 2. The fixing hole 15 is provided by penetrating resist layer 13 being e.g. 70 micrometer in thickness coated on ground pattern 12, ground pattern 12 and substrate 10, nothing is plated on an inner surface of fixing hole 15. The grounding through hole 20 is provided by penetrating resist layer 13, ground pattern 12 and substrate 10 same as fixing hole 15, however, by plating a metal layer 21 being e.g. 30 micrometer made of metal such as gold, silver or copper having large electrically conductivity and solderability. An upper edge 21a and a lower edge 21b of metal layer 21 are widened to a flange shaped edge respectively.

Figure 1:
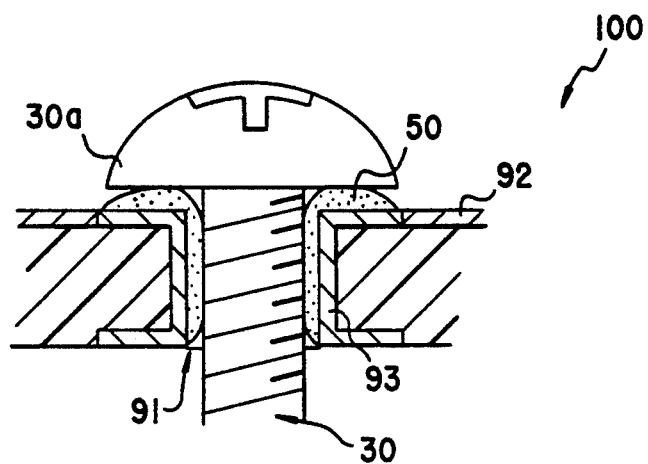
FIG. 1 is a partially cross sectional view of the prior art grounding structure of a printed wiring board, illustrating that a fixing screw is screwed to a frame through a fixing hole whose inner surface is soldered.
Figure 4:
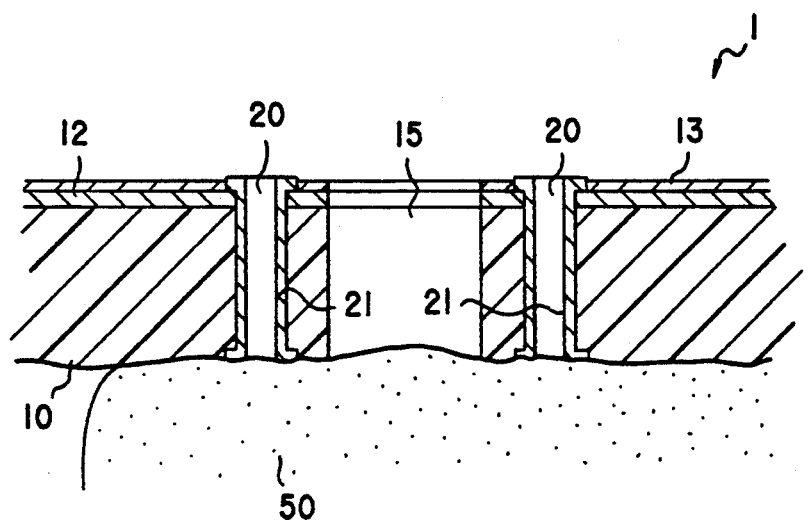
FIG. 4 is a partially cross sectional view of the grounding structure embodying the present invention in reference to FIG. 3, illustrating that a lower surface of the printed wiring board is dipped in a pool of melted solder.

A lower surface of printed wiring board 1 in FIG. 2 or 3 is dipped in a pool of melted solder for soldering electrical elements to wiring pattern 11 through usual through holes. The usual through holes not depicted in FIGS. 1 or 2 are provided in wiring pattern 11. Therefore, when the lower surface of printed wiring board 1 is dipped in the melted solder, grounding through holes 20 are also filled with melted solder. FIG. 4 is a partial cross sectional view around fixing hole 15 and grounding through holes 20 same as FIG. 3, showing that the lower surface of printed wiring board 1 is just dipped in the pool of melted solder 50. In FIG. 4, the same reference numeral as in FIG. 3 designates the same part as in FIG. 3. When the lower surface of printed wiring board 1 is dipped in melted solder 50 thus, melted solder 50 is raised from the pool toward the upper surface of printed wiring board 1 through grounding through holes 20 along metal layers 21 in accordance with the capillary action of melted solder 50, however, not through fixing hole 15. Because an inner surface of fixing hole 15 is the insulating material being not solderable.

Figure 5:
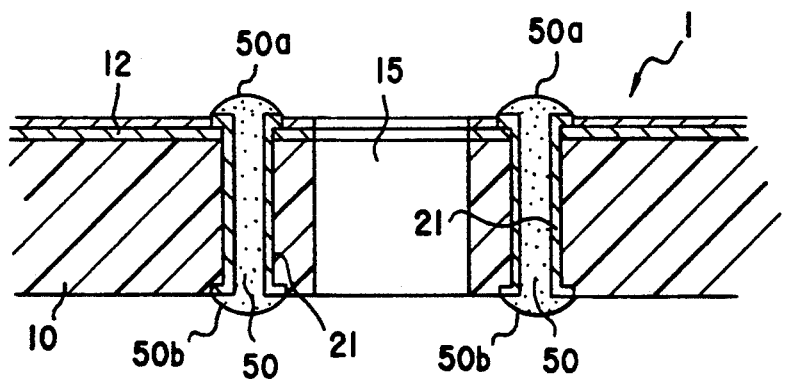
FIG. 5 is a partially cross sectional view of the grounding structure embodying the present invention in reference to FIG. 4, illustrating that two grounding holes are filled with solder.

When printed wiring board 1 is drawn out from melted solder 50, melted solder 50 raised in grounding holes 50 is left in grounding holes 50 forming a spherical end on the upper and lower flange shaped edges 21a and 21b because of the surface tension and viscosity of melted solder 50, which is shown in FIG. 5. FIG. 5 is a partial cross sectional view around fixing hole 15 and grounding through holes 20 same as FIG. 4, showing printed wiring board 1 drawn out from the pool of melted solder 50. The melted solder 50 left in grounding through holes 20 is hardened soon as shown in FIG. 5. The solder 50 hardened in grounding through holes 21 works as a rivet tightened to printed wiring board 1, because solder 50 spreads over upper and lower flange edges 21a and 21, making spherical surfaces 50a and 50b respectively.

Figure 6:
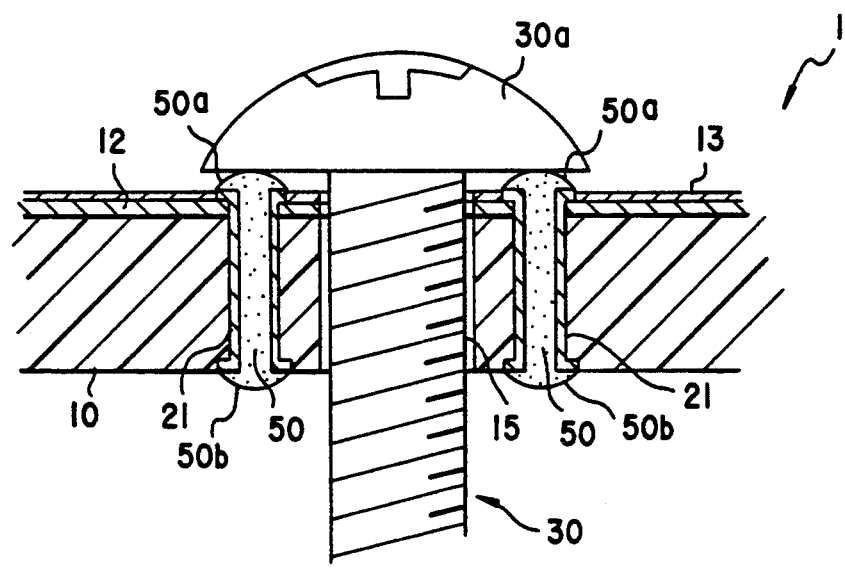
FIG. 6 is a partially cross sectional view of the grounding structure embodying the present invention in reference to FIG. 5, illustrating that the printed wiring board is fixed to the frame by the fixing screw screwed through the fixing hole by firmly touching spherical upper ends of solder filled in the grounding holes.

The distance between fixing hole 15 and each grounding through hole 20 is determined so as to be less than a radius of the lower flat surface of round head 30a, which is shown in FIG. 6. FIG. 6 is a partially sectional view of fixing hole 15 and grounding through holes 20 fill with solder 50, showing that printed wiring board 1 is fixed to the frame by fixing screw 30 screwed through fixing hole 15. In FIG. 6, the same reference numeral as in FIG. 5 designates the same part as in FIG. 5. As seen from FIG. 6, when fixing screw 30 is screwed to the frame through fixing hole 15 so that the lower flat surface of head 30a is tightly touched to the spherical surfaces 50a, ground pattern 12 is grounded to the frame through the flange shaped edge of metal layers 21, the upper ends each having spherical surface 50a of solder 50, head 30a of fixing screw 30 and fixing screw 30.

In the preferred embodiment of the present invention explained above in reference to FIGS. 2 to 6, the number of grounding through holes 20 is eight. However, if there is no space to provide a plurality of grounding through holes 20, at least one grounding through hole 20 is enough, however, two grounding through holes 20 would be better if there is a room to be provided in ground pattern 12.

What is claimed is:

1. A printed wiring board to be fixed to a frame by screws, including a substrate made of electrically insulating material and a ground pattern provided on an upper surface of the printed wiring board, said printed wiring board comprising:

fixing holes provided by penetrating the printed wiring board through the ground pattern and the substrate, for making the screws fix the printed wiring board to the frame; and at least one grounding through hole provided near by at least one of said fixing holes by penetrating the printed wiring board through the ground pattern and the substrate, said grounding through hole being filled with solder so that the solder is electrically connected with the ground pattern and an upper surface of the solder filled in said ground through hole is raised from an upper surface of the printed wiring board so as to be touched with a head of the screw when the printed wiring board is fixed to the frame by the screw screwed through the fixing hole.

2. A printed wiring board according to claim 1, wherein said grounding through hole is internally plated with a metallic layer made of electrically conductive and solderable material so that an upper end of the metallic layer appears on the upper surface of the printed wiring board and connected with the ground pattern and a lower end of the metallic layer appears on a lower surface of the printed wiring board, for raising solder up toward the upper surface of the printed wiring board through said grounding through hole and filling said grounding through hole when the lower surface of the printed wiring board is dipped in a pool of melted solder.

3. A printed wiring board according to claim 2, wherein the upper end of the metal layer is made to a flange shaped end for making the melted solder raised to the upper end of the metal layer form a spherical surface on the flange shaped end, raised from the upper surface of the printed wiring board.

4. A printed wiring board according to claim 3, wherein the lower end of the metal layer is made to a flange shaped end for making the melted solder left in the metal layer form a spherical surface on the flange shaped end, raised from the lower surface of the printed wiring board.

5. A printed wiring board according to claim 1, wherein said grounding through hole is located within a distance less than a radius of a lower flat surface of a screw's round head.

* * * * *